(12) United States Patent
Gerling et al.

(10) Patent No.: US 9,418,819 B2
(45) Date of Patent: Aug. 16, 2016

(54) ASYMMETRICAL DETECTOR DESIGN AND METHODOLOGY

(71) Applicant: KLA-Tencor Corporation, Milpitas, CA (US)

(72) Inventors: John Gerling, Livermore, CA (US); Tomas Plettner, San Ramon, CA (US); Mehran Nasser-Ghodsi, Hamilton, MA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 0 days.

(21) Appl. No.: 14/476,537

(22) Filed: Sep. 3, 2014

(65) Prior Publication Data

US 2015/0069234 A1   Mar. 12, 2015

Related U.S. Application Data

(60) Provisional application No. 61/874,834, filed on Sep. 6, 2013.

(51) Int. Cl.
*G21K 5/04* (2006.01)
*H01J 37/28* (2006.01)
*H01J 37/244* (2006.01)

(52) U.S. Cl.
CPC .............. *H01J 37/28* (2013.01); *H01J 37/244* (2013.01); *H01J 2237/2446* (2013.01); *H01J 2237/28* (2013.01)

(58) Field of Classification Search
USPC ............. 250/396 R, 397, 305, 306, 309, 310, 250/311, 492.1, 492.2, 492.3
See application file for complete search history.

(56) References Cited

U.S. PATENT DOCUMENTS

| | | |
|---|---|---|
| 4,023,173 A | 5/1977 | Hidaka |
| 4,329,684 A | 5/1982 | Monteath et al. |
| 4,637,040 A | 1/1987 | Sohval et al. |
| 4,803,357 A | 2/1989 | Brust |
| 4,831,266 A | 5/1989 | Frosien et al. |
| 5,981,947 A | 11/1999 | Nakasuji et al. |
| 6,282,260 B1 | 8/2001 | Grodzins |

(Continued)

FOREIGN PATENT DOCUMENTS

| | | |
|---|---|---|
| IN | 200802051 P4 | 2/2009 |
| IN | 200901536 P4 | 2/2010 |

(Continued)

OTHER PUBLICATIONS

U.S. Appl. No. 61/874,834, filed Sep. 6, 2013.

(Continued)

*Primary Examiner* — Nicole Ippolito
(74) *Attorney, Agent, or Firm* — Joshua D. Isenberg; JDI Patent

(57) ABSTRACT

A charged particle detection device has an active portion for configured to produce a signal in response secondary charged particles emitted from a sample landing on the active portion. The active portion is shaped to accommodate an expected asymmetric pattern of the secondary charged particles at a detector. This abstract is provided to comply with rules requiring an abstract that will allow a searcher or other reader to quickly ascertain the subject matter of the technical disclosure. It is submitted with the understanding that it will not be used to interpret or limit the scope or meaning of the claims.

20 Claims, 7 Drawing Sheets

(56) References Cited

U.S. PATENT DOCUMENTS

| | | |
|---|---|---|
| 6,777,675 B2 | 8/2004 | Parker et al. |
| 7,122,795 B2 | 10/2006 | Parker |
| 7,345,754 B1 | 3/2008 | Zhao et al. |
| 7,368,739 B2 | 5/2008 | Kristiansson et al. |
| 7,417,227 B2 | 8/2008 | Matsumoto et al. |
| 7,425,708 B2 | 9/2008 | Slowko |
| 7,435,977 B2 | 10/2008 | Freer et al. |
| 7,564,555 B2 | 7/2009 | Boef et al. |
| 7,619,737 B2 | 11/2009 | Mos et al. |
| 7,659,514 B2 | 2/2010 | Adamec |
| 7,933,378 B2 | 4/2011 | Proksa |
| 8,111,398 B2 | 2/2012 | Schaar et al. |
| 8,513,619 B1 | 8/2013 | Nasser-Ghodsi et al. |
| 8,618,513 B2 | 12/2013 | Plettner et al. |
| 2002/0153483 A1* | 10/2002 | Parker .................. H01J 37/244 250/310 |
| 2007/0145298 A1 | 6/2007 | Freer et al. |
| 2011/0249247 A1 | 10/2011 | Cramer et al. |
| 2012/0206703 A1 | 8/2012 | Bhattacharyya et al. |
| 2014/0218503 A1 | 8/2014 | Gerling et al. |
| 2014/0239805 A1 | 8/2014 | Plettner |

FOREIGN PATENT DOCUMENTS

| | | |
|---|---|---|
| IN | 259620 B | 3/2014 |
| JP | 2004342470 A | 12/2004 |
| JP | 4489845 B2 | 6/2010 |
| JP | 4672704 B2 | 4/2011 |
| JP | 05280555 B2 | 9/2013 |
| JP | 5412528 | 2/2014 |
| KR | 20080078057 A | 8/2008 |
| KR | 100930654 B1 | 12/2009 |
| WO | 9823208 A2 | 6/1998 |
| WO | 2004027809 A2 | 4/2004 |
| WO | 2009130010 A9 | 7/2010 |
| WO | 2011048060 A2 | 4/2011 |
| WO | 2012021652 A2 | 2/2012 |
| WO | 2012/123843 A1 | 9/2012 |

OTHER PUBLICATIONS

Co-Pending U.S. Appl. No. 14/485,588, to Thomas Plettner et al., filed Sep. 12, 2014.
Co-Pending U.S. Appl. No. 14/486,739, to Thomas Plettner et al., filed Sep. 15, 2014.
Co-Pending U.S. Appl. No. 14/485,574, to Thomas Plettner et al., filed Sep. 12, 2014.
U.S. Appl. No. 61/878,545, to Tomas Plettner et al., filed Sep. 16, 2013.
U.S. Appl. No. 61/878,606, to Tomas Plettner et al., filed Sep. 17, 2013.
U.S. Appl. No. 61/878,609, to Tomas Plettner et al., filed Sep. 17, 2013.
U.S. Appl. No. 61/874,834, to John Gerling et al., filed Sep. 17, 2013.
International Search Report and Written Opinion for International Application No. PCT/US2014/054083, dated Dec. 15, 2014.

* cited by examiner

ASYMMETRICAL DETECTOR DESIGN AND METHODOLOGY

CLAIM OF PRIORITY

This application is a nonprovisional of and claims the priority benefit of commonly owned, U.S. Provisional Patent Application No. 61/874,834, to John Gerling et al., filed Sep. 6, 2013, and entitled "ASYMMETRICAL DETECTOR DESIGN AND METHODOLOGY" the entire disclosures of which are incorporated herein by reference.

FIELD OF THE INVENTION

Embodiments of the present invention relate to charged particle detection and detection devices, and more particularly, to an optimal detector layout design for secondary charged particle detectors in a charged particle system using multiple columns for line scans.

BACKGROUND OF THE INVENTION

Secondary charged particles are emitted from a surface of the specimen to be examined when electron or ion source impinges on the surface with sufficient energy. Since the energy and/or the energy distribution of such secondary charged particles offers information as to the topography of the specimen, detectors are employed to detect the secondary charged particles and convert them to electrical signals used to generate images of the specimen. Scanning electron microscopes (SEMs) are generally provided with such a detection device for secondary electrons.

Specifically in SEMs, an electron beam source generates a primary electron beam passing through a hole in the middle of a detection device. A variable electrostatic or magnetic field deflects the primary electron beam to scan it over a region of a specimen. When the primary beam strikes the specimen, secondary electrons are generated. Such particles have an energy which is significantly lower than that of the particles in the primary electron beam, e.g., 50 eV. Some of these secondary electrons pass back up through the electron optical column and interact with the primary beam deflection fields as they pass back through the optical column. Thereafter these secondary electrons are imaged onto the detection device.

To collect as many of the secondary electrons as possible, conventional SEM systems use secondary electron detectors that are relatively large. However, since leakage current and capacitance of a detector (e.g., a photodiode) are proportional to the detector area (e.g., the area of the photodiode depletion zone), it is not desirable to have an excessive detector area. In addition, conventional secondary electron detectors are typically rotationally symmetric. However, while the detector may be rotationally symmetric, the pattern of electrons landing on the detector might not be symmetric. Secondary electrons traveling back up through the optical column tend to undergo rotation and deflection as a result of magnetic fields used in immersion lenses or the deflection by the optical column. The amount of rotation depends partly on the landing energy of the primary electrons. Higher energy electrons undergo less rotation since they spend less time in the magnetic field due to their relatively high velocities.

Conventional detectors generally include a metal shield to cover up any exposed dielectric on the detectors to prevent charging that would produce a deflection field. For example, prior art SEM systems use a MEMS-type shield made of thin metal foil that is patterned (e.g., by laser) and bonded to the detector. The shield and the detectors are conventionally manufactured separately and are integrated afterwards. Thus, conventional detectors require additional process steps that confer additional cost and complexity of alignment or assembly.

It is within this context that aspects of the present disclosure arise.

SUMMARY

According to aspects of the present disclosure, a charged particle detector has an active portion configured to generate a signal in response to secondary charged particles emitted from a sample landing on the active portion. The active portion of the charged particle detector is shaped to accommodate an expected asymmetric distribution of the secondary charged particles at the detector.

In some implementations, an electrically conductive layer deposited and/or formed on selected parts of the device other than the active portion.

In some implementations the active portion of the charged particle detector is sector-shaped.

In some implementation, the charged particle detector is a diode device having a junction and a depletion region.

In some implementation, the charged particle detection device is a PN junction, PIN junction, CMOS detector, CCD, silicon-based/III-V detector, multi-channel plate, avalanche photodiode or Schottky diode.

The charged particle detection device may include an aperture, e.g., in the middle or other location of the detection device. The aperture may be surrounded by an inactive area. The aperture and the inactive area may be sized to keep signal clipping losses of detection of charged particles to less than 1%.

According to aspects of the present disclosure, a charged particle optical system comprises a charged particle optical column configured to collect charged particles from a sample and image the charged particles onto a detector. The detector includes active portion configured to produce a signal in response to a flux of the charged particles impinging on the active portion. The active portion is shaped to accommodate an expected asymmetrical pattern of the secondary charged particles at the detector.

In some implementations, the system further includes a source configured to emit energetic particles that impinge on the sample.

In some implementations, the charged particle optical system is a scanning electron microscope (SEM) system, wherein the system further includes an electron source configured to emit primary electrons, and wherein the charged particle optical column is configured to direct the primary electrons onto the sample.

In some implementations, the detector is located between the electron source and an end of the charged particle optical column that is closest to the sample, wherein the detector includes an aperture configured to allow at least a portion of the primary electrons to pass through the detector towards the target.

In some implementations, the aperture is surrounded by an inactive area, wherein the aperture and the inactive area are sized to keep signal losses due to clipping of detection of the secondary charged particles to less than 1%.

In some implementations, the detector in the system further comprises a metallization layer on portions of the detector other than the active portion, wherein the metallization layer is formed as an integral part of the detector.

In some implementations the detector in the system is a diode device having a junction and a depletion region.

In some implementations, the primary optical column of the charged particle optical system has a source configured to emit energy beam that passes through the primary optical column before impinging on the sample.

In some implementations, the detector is located between the energy source and an end of the optical column that is closest to the sample. In such implementations, the detector may include an aperture in the middle or other location of the detection device to permit the energy beam to pass through the detector. The aperture may be surrounded by an inactive area, wherein the aperture and the inactive area are sized to keep signal clipping losses of detection of charged particles to less than 1%.

In some implementations, the charged particle optical system is a scanning electron microscope (SEM), a focused ion beam system, ultraviolet photoelectron spectroscopy system (UPS), an X-ray photoelectron spectroscopy (XPS) system, an auger electron spectroscopy (AES) system, and/or a Secondary Ion Mass Spectroscopy (SIMS) system.

BRIEF DESCRIPTION OF THE DRAWINGS

Objects and advantages of the invention will become apparent upon reading the following detailed description and upon reference to the accompanying drawings in which.

DETAILED DESCRIPTION

In the following Detailed Description, reference is made to the accompanying drawings, which form a part hereof, and in which is shown by way of illustration specific embodiments in which the invention may be practiced. The drawings show illustrations in accordance with examples of embodiments, which are also referred to herein as "examples". The drawings are described in enough detail to enable those skilled in the art to practice the present subject matter. Because components of embodiments of the present invention can be positioned in a number of different orientations, directional terminology is used for purposes of illustration and is in no way limiting. It is to be understood that other embodiments may be utilized and structural or logical changes may be made without departing from the scope of the present invention.

In this document, the terms "a" and "an" are used, as is common in patent documents, to include one or more than one. In this document, the term "or" is used to refer to a nonexclusive "or," such that "A or B" includes "A but not B," "B but not A," and "A and B," unless otherwise indicated. The following detailed description, therefore, is not to be taken in a limiting sense, and the scope of the present invention is defined by the appended claims.

Figure 1A:
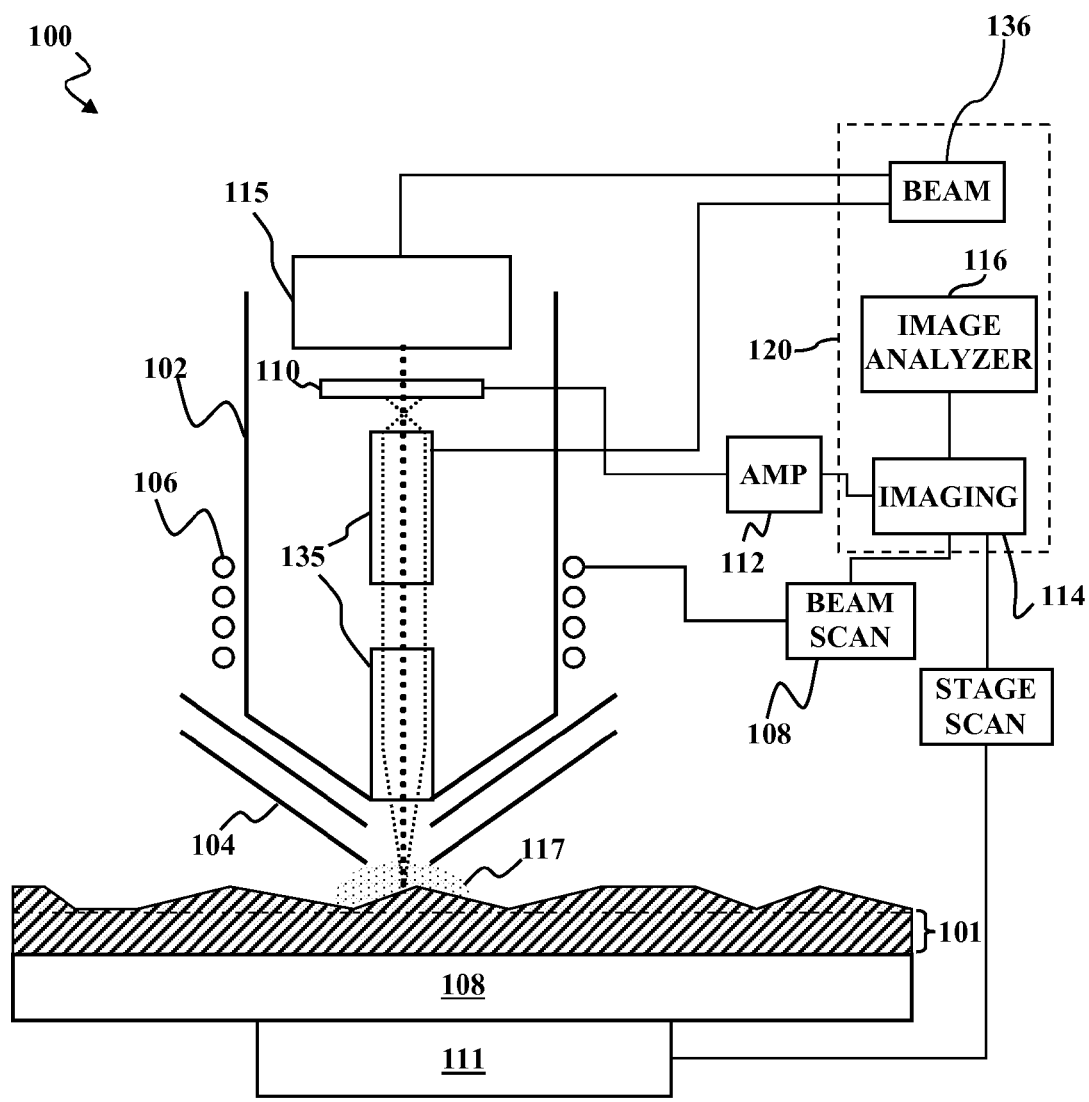
FIG. 1A is a schematic diagram of an electron beam system adapted to include a detector according to an aspect of the present disclosure.
Figure 1B:
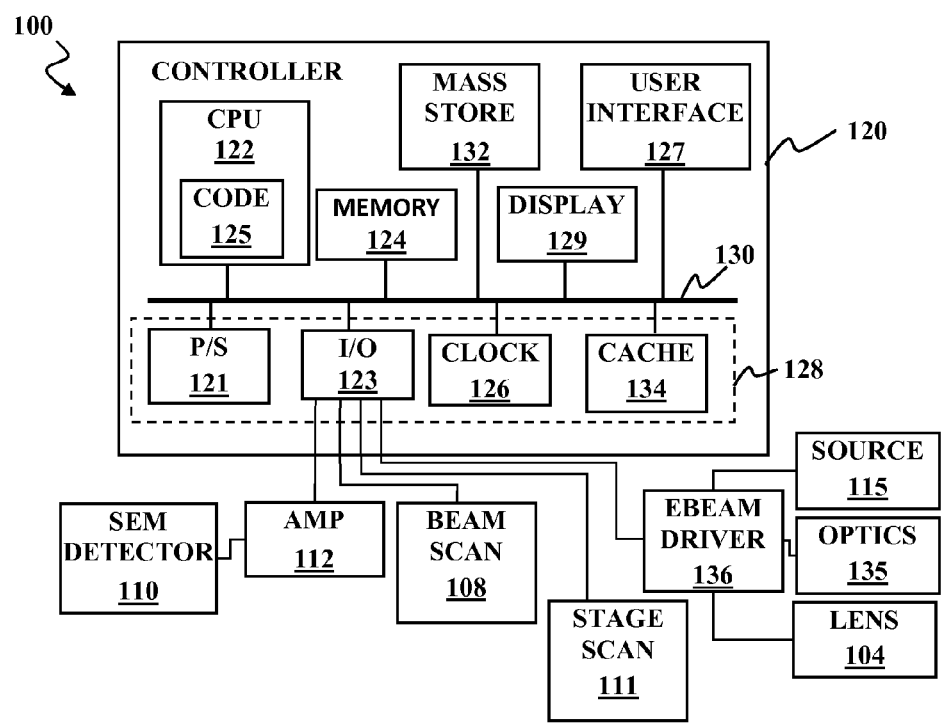
FIG. 1B is a block diagram of the system of FIG. 1A.

FIG. 1A and FIG. 1B illustrate an example of a charged particle system 100 incorporating certain aspects of the present disclosure. In this non-limiting example, the system 100 is configured as a scanning electron microscope (SEM) having charged particle optical column 102 with an electron source 115, beam optics 135, a magnetic immersion lens 104. The optical column 102 may be controlled by electronics 136, referred to herein as a beam driver. The beam driver 136 may control the electron source 115, beam optics 135 and immersion lens 104. In this example, the beam optics 135 extract electrons from the source 115 and form them into a primary beam that travels in the direction of the target 101. The immersion lens 104 focuses the primary beam into a narrow spot at the surface of the target.

Electrons from the electron beam column 102 are focused onto a target surface 101, which may be an integrated circuit wafer or a test wafer. The target 101 is supported by a stage 118. The electrons may be scanned across the surface of the target 101, e.g., by magnet deflecting fields provided by one or more scanning coils or electrostatic deflector plates 106. In some implementations, the beam scanner driver 108 may provide current to deflector coils 106 via a beam scanner driver 108. In other implementations, the beam scanner driver 108 may apply voltages to electrostatic deflector plates to scan the electron beam across the target 101. Alternatively, the stage 118 may include a stage scanning mechanism 111 and stage scanner driver 119 configured to move the target along X-Y plane parallel to the surface of the target 101 in one or more directions relative to the optical column 102. In some implementations the stage scanning mechanism 111 and stage scanner driver 119 may move the stage in one direction (e.g., the X direction) as the beam scanner driver 108 scans the beam in a different direction (e.g., the Y direction). Alternatively, the stage scanner driver 119 may drive the stage in both the X and Y directions relative to the optical column 102 to scan the beam across the target while the beam remains fixed relative to the optical column.

Electrons striking the target 101 are either backscattered or initiate secondary emission. The electron beam column collects a portion of such backscattered or secondary electrons 117 that emerge from the surface of the target 101. The collected electrons 117 travel back up through the electron beam column and impinge on a detector 110, which generates a signal proportional to the amount of backscattering or secondary emission. The signal may be amplified by an amplifier 112. The amplified signal and a signal from the beam scanner driver 108 and/or stage scanner driver 119 are combined by an image generator 114 to produce a high-contrast, magnified image of the surface of the target 101. The images generated by the image generator 114 may be analyzed by the image analyzer 116, e.g., to determine a measure of quality of the modified surface or shape and size of resulting formed structures.

In alternative implementations, sources of energetic particles other than electrons (e.g., ions, neutrons, ultraviolet radiation, or X-rays) may be used as alternatives to the electron source 115, depending on the nature of the system. In addition, the energetic particle source may be separate from and/or located outside of the charged particle optical column 102. For example, in X-ray photoelectron spectroscopy (XPS) the primary energetic particles may be X-rays that initiate emission of secondary electrons from the target. In ultraviolet photoelectron spectroscopy (UPS) the primary energetic particles may be ultraviolet photons that similarly initiate emission of secondary electrons from the target. Also, in alternative implementations, other types of charged particles (e.g., positive or negative ions) may backscatter from or be emitted by the target and pass back up through the optical column 102 to impinge on the detector 110. For example, in secondary ion mass spectroscopy (SIMS) the primary particles are energetic ions and the secondary charged particles are ionized atoms of the target material that are knocked off of the target as a result of energetic impact by the primary ions.

Some charged particle systems include a charged particle energy analyzer (e.g., a cylindrical mirror analyzer, Bessel box, parallel plate analyzer) as part of the optical column 102 between the immersion lens 104 and the detector 110. Such spectrometers are used for energy selection of secondary electrons, e.g., as in Auger electron spectroscopy (AES) for chemical analysis of the target 101. Other systems include a mass spectrometer (e.g., a magnetic sector, RF quadrupole, or Wien filter to select secondary charged particles by mass, e.g., as in SIMS systems.

By way of example, and not by way of limitation, images may be generated by driving the beam scanner in a raster pattern in which the primary beam scans across the sample 101 in one direction with the beam scanner driver 108 and beam scanner coils 106 (or deflector plates) and the detector signal as a function of beam position is converted into a line of the image as is well known in the art. At an end of the scan of the beam in one direction (e.g., the X-direction), the beam location may be adjusted by a small amount (e.g., an amount comparable to a size of the beam spot on the sample) in a different direction (e.g., the Y-direction) and another scan may be performed to generate another line of the image. By repeating this process an image of part of the sample may be generated.

In alternative implementations, images may be generated by scanning the primary beam across the sample 101 in one direction (e.g., the X-direction) and converting the detector signal as a function of beam position into a line of the image. The stage scanner driver 119 and stage scanning mechanism may translate the sample 101 by a small amount in a different direction (e.g., the Y-direction) at the end of each line scan.

Detector 110 may be a diode device with a junction and depletion region. By way of example and not by way of limitation, detector 110 can be a PN junction, a PIN junction. In alternative implementations, the detector 110 may be a CMOS detector (e.g., a charge coupled device (CCD)), silicon-based or III-V detector, multi-channel plate, photodiode array, avalanche photodiode and/or Schottky diode.

In one example, the detector 110 is PN junction diode that includes a positively doped P region and a negatively doped N region. A depletion region, an area of neutral charge, exists between the P and N regions. When a photon enters the device, electrons in the crystalline structure become excited. If the energy of the photon is greater than the bandgap energy of the material, electrons will move into the conduction band crating holes in the valence band where the electrons were. These electron-hole pairs are created throughout the device. Those generated in the depletion region drift to their respective electrons. This results in a positive charge buildup in the P layer and a negative one in the N layer. The amount of charge is directly proportional to the amount of light falling on the detector.

As noted above, conventional detectors have relatively large and symmetrical design for the active portion for collecting the electrons. According to aspects of the present disclosure, the detector 110 may have a layout design (as discussed below in connection with FIG. 2) that may be optimized for use in a charged particle system that uses one or more columns for line scans while moving the target relative to the column 102 perpendicular to the scan direction. It should be noted that in addition to SEM systems, many other charged particle systems may employ the secondary charged particle detection device according to the present disclosure. Examples of systems may include systems configured to implement focused ion beam (FIB), ultraviolet photoelectron spectroscopy (UPS), X-ray photoelectron spectroscopy (XPS), Auger electron spectroscopy (AES), and Secondary Ion Mass Spectroscopy (SIMS).

As shown in the block diagram of FIG. 1B, the image generator 114 and image analyzer may be part of a controller 120. The controller 120 may be a self-contained microcontroller. Alternatively, the controller 120 may be a general purpose computer configured to include a central processor unit (CPU) 122, memory 124 (e.g., RAM, DRAM, ROM, and the like) and well-known support circuits 128 such as power supplies 121, input/output (I/O) functions 123, clock 126, cache 134, and the like, coupled to a control system bus 130. The memory 124 may contain instructions that the CPU 122 executes to facilitate the performance of the system 100. The instructions in the memory 124 may be in the form of the program code 125. The code 125 may control, e.g., the electron beam voltage and current produced by the source 115, the focusing of the beam with the beam optics 135 and the immersion lens 104, the scanning of the electron beam by the coils 106, the scanning of the stage 118 by the stage scanner 111 and the formation of images with the signal from the detector 110 in a conventional fashion. The code 125 may also implement analysis of the images.

The code 125 may conform to any one of a number of different programming languages such as Assembly, C++, JAVA or a number of other languages. The controller 120 may also include an optional mass storage device, 132, e.g., CD-ROM hard disk and/or removable storage, flash memory, and the like, which may be coupled to the control system bus 130. The controller 120 may optionally include a user interface 127, such as a keyboard, mouse, or light pen, coupled to the CPU 122 to provide for the receipt of inputs from an operator (not shown). The controller 120 may also optionally include a display unit 129 to provide information to the operator in the form of graphical displays and/or alphanumeric characters under control of the processor unit 122. The display unit 129 may be, e.g., a cathode ray tube (CRT) or flat screen monitor.

The controller 120 may exchange signals with the imaging device scanner driver 108, the e-beam driver 135 and the detector 110 or amplifier 112 through the I/O functions 123 in response to data and program code instructions stored and retrieved by the memory 124. Depending on the configuration or selection of controller 120 the scanner driver 108 and detector 110 or amplifier 112 may interface with the I/O functions via conditioning circuits. The conditioning circuits may be implemented in hardware or software form, e.g., within code 125.

Figure 1C:
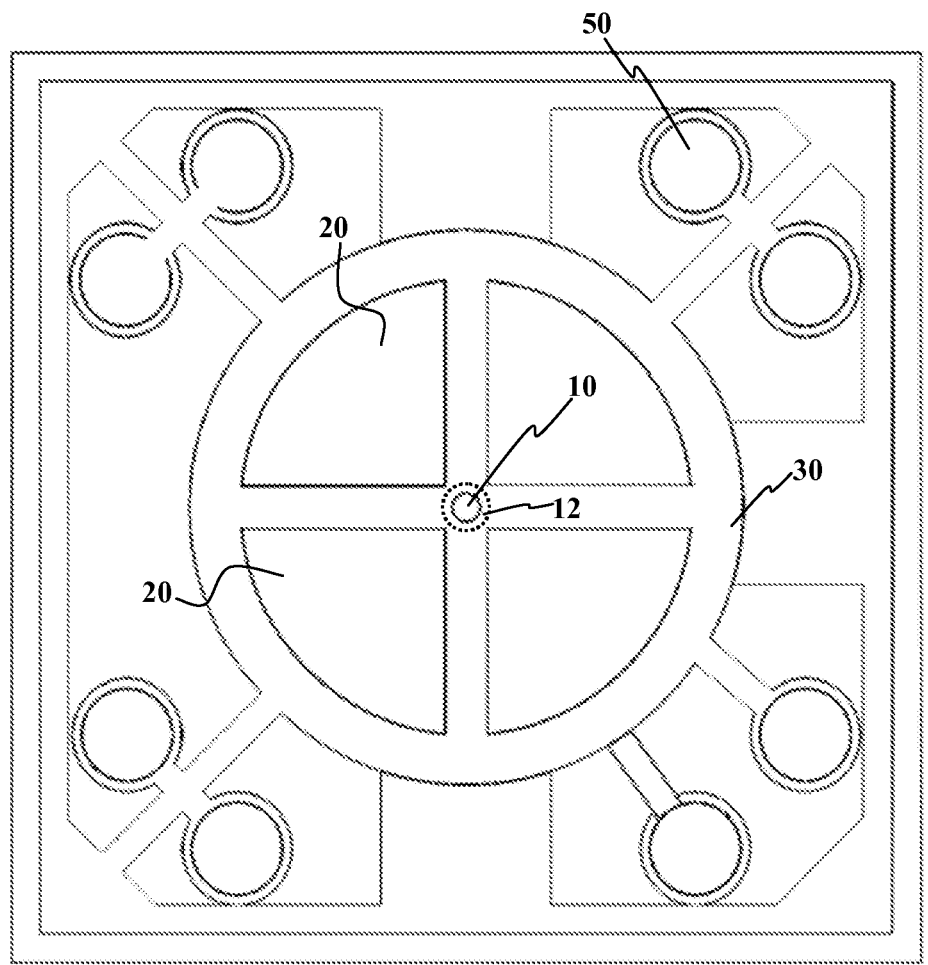
FIG. 1C is a plan view diagram of a conventional secondary electron detection device.

According to aspects of the present disclosure, the detector 110 is of unconventional design. FIG. 1C depicts a detector 1 of conventional design. The detector 1 is a PN junction diode with a central aperture 10, an active portion 20 and a metal shield 30. The active portion 20 is comprises four symmetrically arranged sector-shaped regions that surround the aperture 10. The active portions 20 are electrically isolated by an insulator, e.g., an oxide. In particular, the insulator includes an oxide annulus 12 (shown in phantom) formed around the aperture 10 provides isolation of the detector 110 from leakage effects due to surface or edge states. The insulator, including the annulus 12, is covered by the metal shield 30 to prevent charging. In this example, the aperture 10 is formed through the material of the detector and also through the metal shield 30. The metal shield 30 is fabricated separately from the rest of the detector, e.g., using microelectromechancial systems (MEMS) processing. As noted above, the metal shield complicates assembly of the detector 1. Portions of the shield 30 between the active portion sectors 20 can also cause signal clipping, particularly if the landing pattern of secondary electrons is asymmetric and significant numbers of secondary electrons would land on these portions of the shield.

Figure 2:
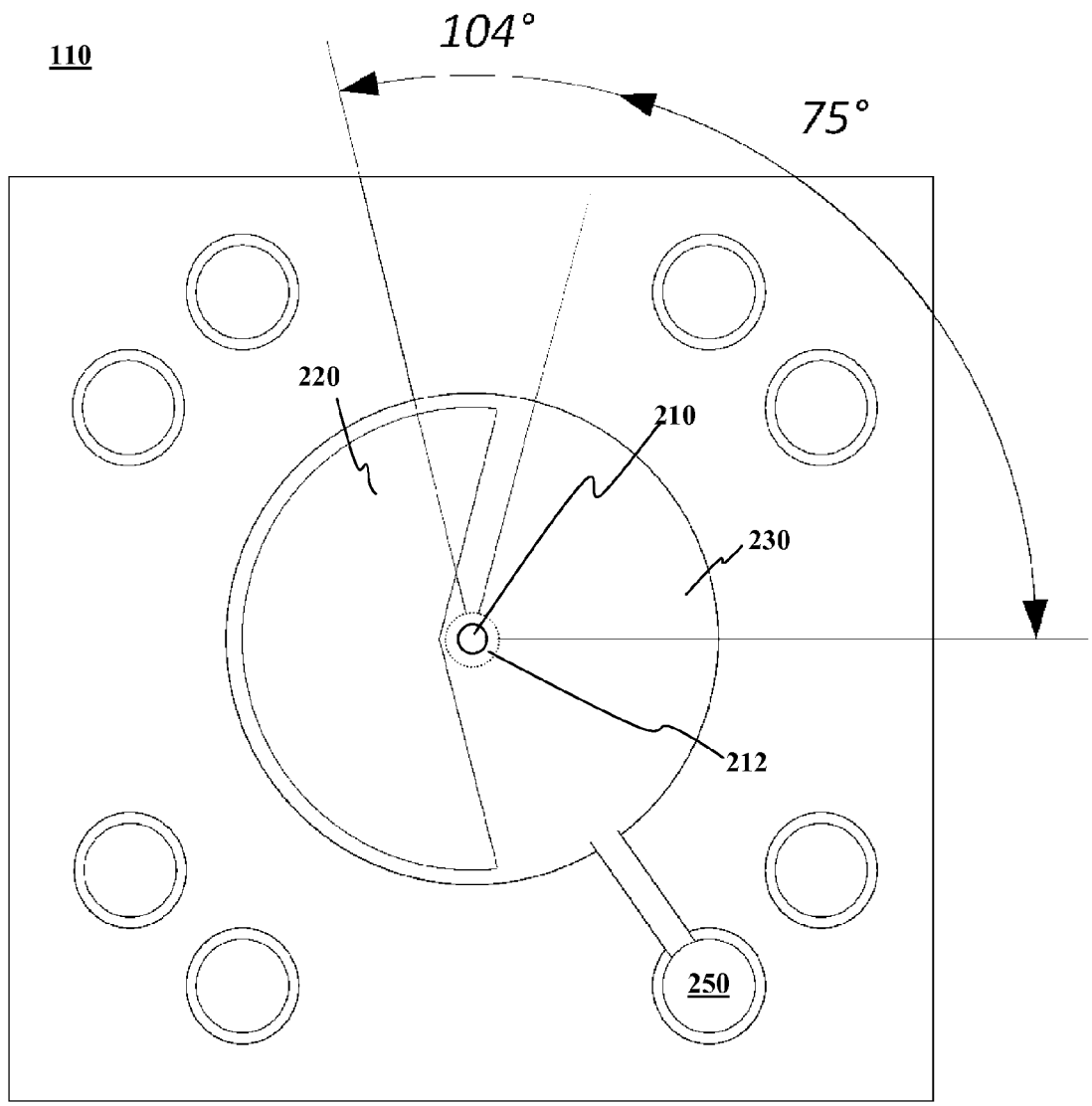
FIG. 2 is a plan view diagram of a secondary electron detection device according to an aspect of the present disclosure.

FIG. 2 shows a schematic layout of an improved detector 110 according to an aspect of the present disclosure. In this example, the detector 110 has an active portion 220 formed on a substrate 218. A through-hole aperture 210 formed through the substrate 218. A metallization area 230 covers certain electrically insulated (non-active) portions of the substrate 218. In this example, the active portion 220 is an approximately sector-shaped region. The through-hole aperture 210 is provided to allow a primary electron beam (or other energetic beam, e.g., ion, neutron, x-ray, ultraviolet) to pass through the detector 110 on its way to a target. In this example, the aperture 210 is formed through the active portion 220 and is located at an axis of symmetry of the substrate 218. In the illustrated example, the substrate 218 is square or rectangular in shape with a symmetry about an axis perpendicular to a plane of the substrate that runs through the center of the aperture 210, which also happens to be the center of the substrate 218 in this example. The aperture 210 may be circular or any other suitable shape. In addition, the aperture 210 may be in the center of the detector 110 (e.g., on an axis of symmetry of the substrate 218 or other locations. In cases where the aperture 210 is off center, the primary beam may be deflected off center to go through the aperture and then deflected back in center to focus it on the sample.

Since PN junctions for the active portion 220 cannot be made all the way to the edge of the aperture 210, an inactive region (sometimes called a dead zone), which may result from an insulating (e.g., oxide) annulus 212, typically exists around the aperture 210. The aperture 210 and the dead zone would cause signal clipping for the secondary electron blobs that overlap them. Since the amount of clipping depends on the size of the aperture and the dead zone, the size of the aperture and the dead zone should be assessed and adjusted so that the signal loss is kept to 1% or less. One alternative solution to reduce the signal loss is to modify the scan pattern to keep the secondary electrons from landing in the dead zone or the aperture.

The active portion 220 of detector 110 is the area that can capture secondary electrons emitted from the surface of a sample. The active portion 220 is shaped to accommodate an expected asymmetrical pattern of the secondary electrons at the detector location. In the example shown in FIG. 2, the substrate 218 is symmetric with respect to an axis through the aperture 210 and the active region 220 is asymmetric with respect to the axis. The asymmetric shape of the active region 220 is configured to accommodate an estimated axially asymmetrical distribution of the secondary particles at the detector 110 with respect to a beam axis of a charged particle beam optical system 100. The expected pattern and location of the secondary electrons at the location of the detector 110 can be determined by computer simulation utilizing knowledge of the electron optic performance, e.g., deflection and rotation of electrons, in a charged particle system. For example, with the deflection conditions (e.g., rotation and deflection) determined for the optical system 100, the positions of secondary electron at the plane of the detector 110 plane can be analyzed via a Matlab script as in FIG. 4.

Figure 4:
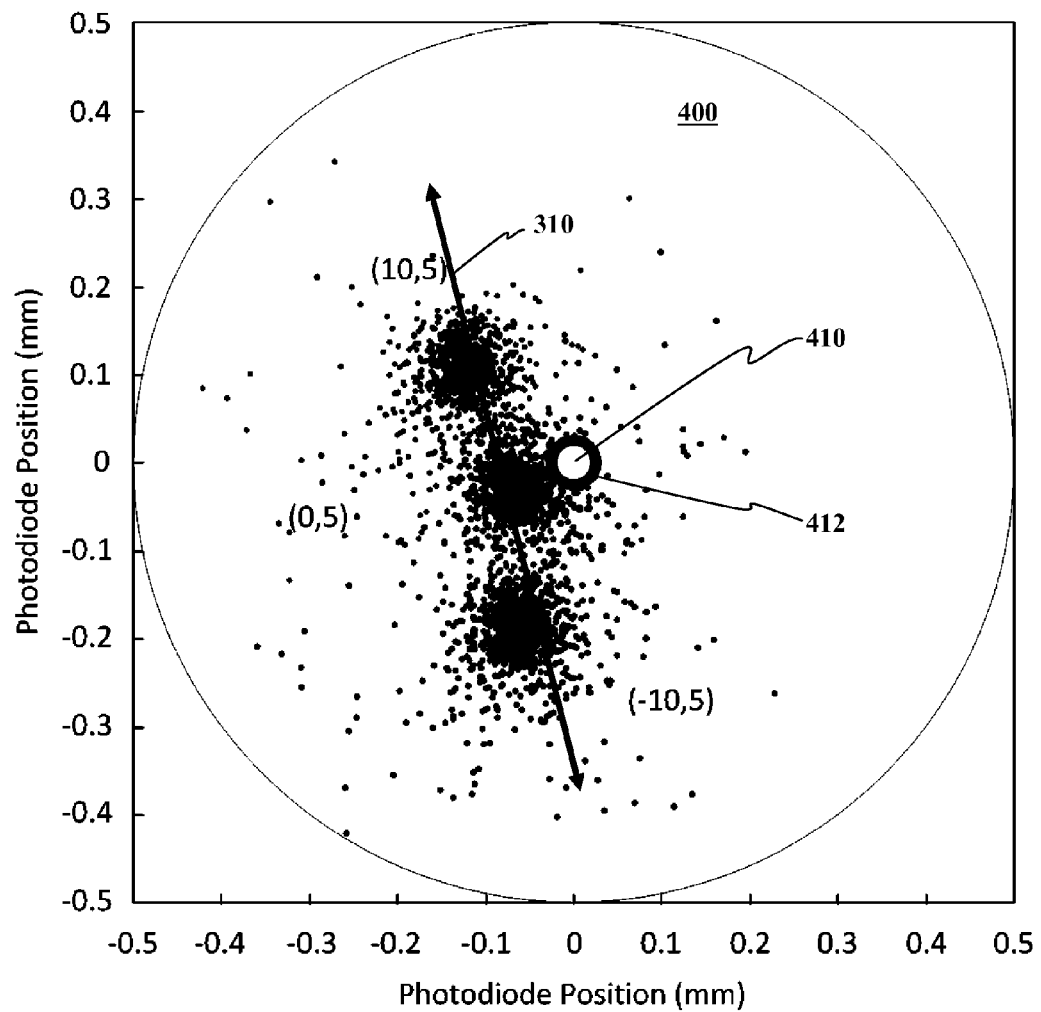
FIG. 4 is a set of graphs showing scatter plots of secondary electron position on a detector according to an aspect of the present disclosure.
Figure 5:
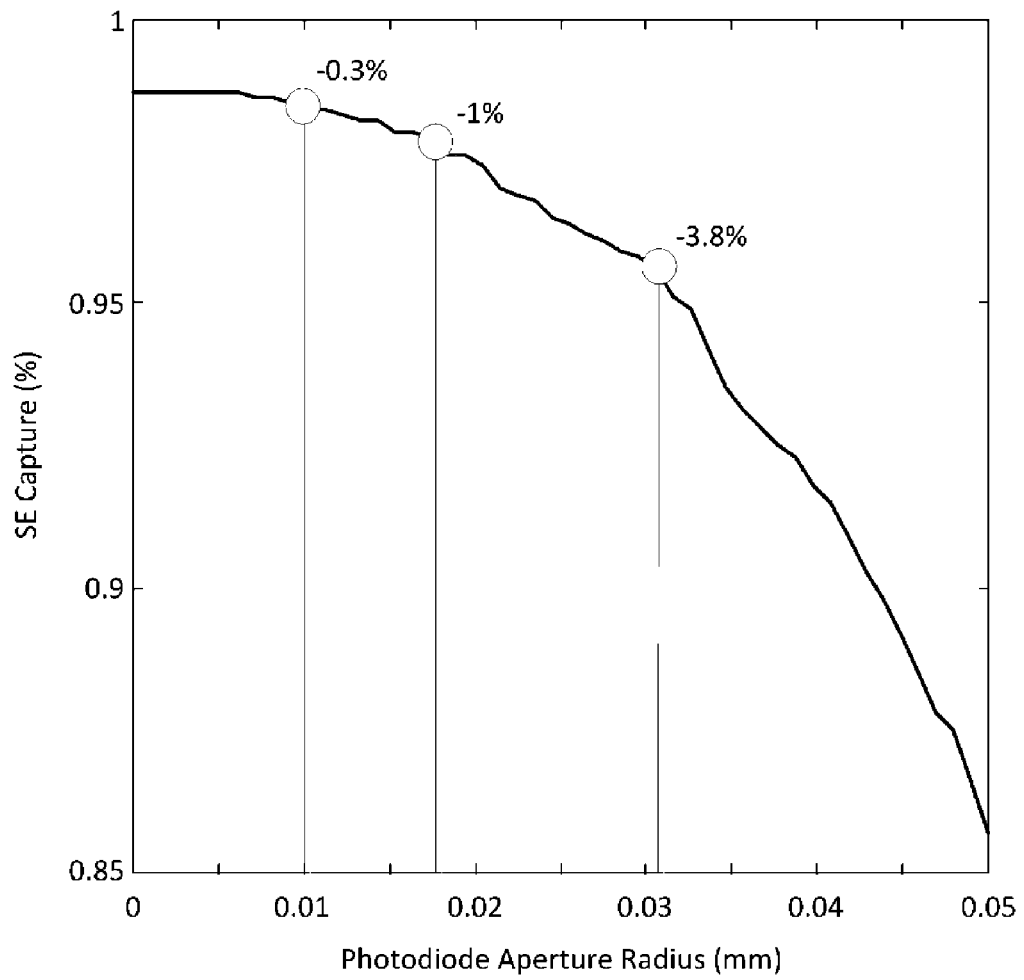
FIG. 5 is a graph showing secondary electron capture as a function of the photodiode aperture radius/dead zone radius for a detector according to an aspect of the present disclosure.

FIG. 4 shows an example of an estimated asymmetric pattern of secondary electrons landing on the active portion in an asymmetrical pattern in a line scan. From the Matlab output, the secondary electron positions can be analyzed as a function of scan position and the capture result can be analyzed as a function of the size of the dead zone/active portion as shown in FIG. 5. According to the simulation, the active portion 220 may be shaped to cover an expected area where the secondary electrons may land at the detector plane. With such an optimized design, the size of the active portion may be reduced, thereby improving leakage current and capacitance as well as the electrical performance and manufacturing yield.

As an example, FIG. 2 shows an active portion 220 in the shape of a sector, e.g., like a pie with a missing piece. In this example, the shape of the active portion 220 has been optimized for capturing the secondary electrons in a particular electron beam system for primary beam landing energies from 500 electron volts (eV) through 3 keV. The angles are chosen to correspond to the secondary electron positions after they have gone through a rotation and then a deflection as they travel back upwards through the optical column 102 to plane of the detector 110 for the different landing energies. The chosen angles are variable depending on the system behavior and can be fine-tuned given prior knowledge of the performance of the optical column 102. It should be noted that the active portion 220 may be in any shape, angle, and/or size as long as it is shaped to accommodate the expected asymmetrical pattern of the secondary electrons at the detector location.

In addition, an electrically conductive layer 230 is provided over portions of the surface of the device other than active portion 220 to prevent charging that would produce a deflection field. The electrically conductive layer 230 is either deposited or formed on selected parts of the surface of the detector which may be isolated from the active portion, e.g., by an insulating layer, such as an oxide. The electrically conductive layer 230 may thus be integrated into the detector 110 and can be manufactured as part of the integrated circuit processing that forms the detector. This simplifies, reduces, or eliminates issues of alignment and assembly of a separate conductive shield and detector. The metallization area 230 may also provide electrical contacts 250.

Figure 3:
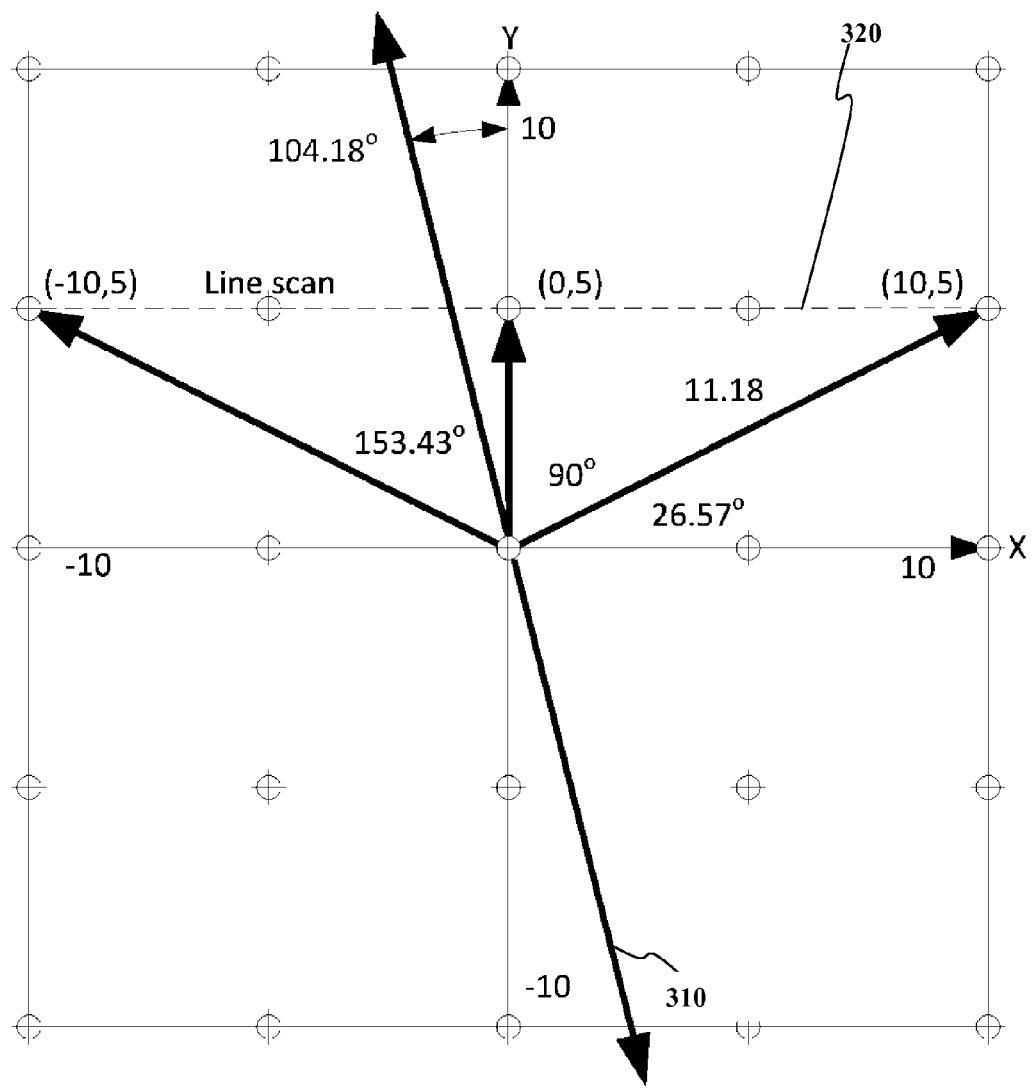
FIG. 3 is a diagram of image plane for a line scan.

To illustrate the effects of beam rotation and the energy spread of secondary electrons it is useful to refer to FIG. 3 and FIG. 4 simultaneously. FIG. 3 depicts an example image plane for a line scan with a landing energy of 500 eV at the target 101. Three example points indicated at (−10,5), (0,5) and (10,5) correspond to three different locations where the primary beam lands on the target 101 during a line scan 320. When secondary electrons from these three locations pass back up through the optical column, they are imaged onto the detector 110 as three different blobs along a detector scan 310 as shown in FIG. 3 and FIG. 4. The detector scan 310 corresponds roughly to the line scan 320 but is rotated through an angle (104.18°) as shown in FIG. 3. It is noted that for a conventional detector with a symmetric active portion like the one shown in FIG. 1C, a significant number of the secondary electrons are likely to land on parts of the metal shield 30 between adjacent active sectors 20. This would result in signal clipping.

FIG. 4 shows blob positions relative to a detector 110 in the form of a 1 mm diameter photodiode 400 with an aperture 410 having a 0.018 mm radius. Each blob represents secondary electrons resulting from primary electrons with 500 eV landing energy impinging on the target 101 at the three corresponding locations (−10,5), (0,5) and (10,5) on the target 101 shown in FIG. 3. As shown in FIG. 4, the three secondary electron blobs land in a roughly sector-shaped region. The secondary electrons land on the detector in blob-shaped patterns for a number of reasons. First, the secondary electrons, unlike backscattered electrons, have a nearly uniform angular distribution. Second, the secondary electrons have a much lower average kinetic energy than backscattered electrons, e.g., about 50 eV. Third, there is distribution of secondary electron kinetic energies. These factors tend to spread the landing locations of the secondary electrons over a larger area than the primary beam spot size at the target.

In the example depicted in FIG. 4, a dead zone 412 is shown as a black annulus surrounding the aperture 410 out to a radius of 0.032 mm. According to aspects of the present disclosure, the size of the dead zone relative to the size of the aperture, and the size of the aperture relative to the size of the detector may be optimized. FIG. 5 is a graph showing secondary electron capture as a function of the photodiode aperture radius and as a function of the dead zone radius with a landing energy of 500 eV and a primary image beam location of (0,5). The optimal diameters/sizes of the through-hole aperture and the dead zone can be determined based on graphs such as FIG. 5 to achieve better capture result.

Aspects of the present disclosure allow for charged particle detectors optimized for use in charged particle optical systems that use a line scan of a primary beam in conjunction with a translating target. The detector area can be made smaller and therefore leakage current and parasitic capacitance can be reduced.

While the above includes a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC §112, ¶6. In particular, the use of "step of" in the claims herein is not intended to invoke the provisions of 35 USC §112, ¶6.

What is claimed is:

1. A charged particle detection device, comprising:
a detector having an active portion and an inactive portion formed on a surface of a substrate, the surface being divided into the active portion and the inactive portion, whereby the active portion and the inactive portion make up an entirety of the surface of the substrate, wherein only the active portion is configured to produce a signal in response to secondary charged particles emitted from a sample landing on the active portion, wherein the substrate is symmetric with respect to an axis through a central aperture and wherein the active portion is asymmetric with respect to the axis to, accommodate an estimated axially asymmetrical distribution of the secondary particles at the detector with respect to a beam axis of a charged particle beam optical system.

2. The device of claim 1, wherein the active portion is sector-shaped.

3. The device of claim 1, further comprising a metallization layer on portions of the substrate other than the active portion, wherein the metallization layer is formed as an integral part of the device.

4. The device of claim 1, wherein the charged particle detection device is a diode device and wherein the active portion includes a junction and a depletion region.

5. The device of claim 1, wherein the charged particle detection device is a PN junction, PIN junction, CMOS detector, CCD, silicon-based/III-V detector, multi-channel plate, avalanche photodiode and/or Schottky diode.

6. The device of claim 1, further comprising an aperture in the detection device.

7. The device of claim 6, wherein the aperture is formed through the substrate at an axis of symmetry of the substrate.

8. The device of claim 7, wherein the aperture is surrounded by an inactive area, wherein the aperture and the inactive area are sized to keep signal losses due to clipping of detection of the secondary charged particles to less than 1%.

9. The device of claim 1, wherein the active portion is single sector-shaped region of the surface of the substrate.

10. A charged particle optical system, comprising:
a charged particle optical column configured to collect charged particles from a sample and image the charged particles onto a detector, wherein the detector has an active portion and an active portion formed on a surface of a substrate, the surface being divided into the active portion and the inactive portion, whereby the active portion and the inactive portion make up an entirety of the surface of the substrate, wherein the active portion is configured to produce a signal in response to secondary charged particles emitted from a sample landing on the active portion, wherein the substrate is symmetric with respect to an axis through a central aperture and wherein the active portion is asymmetric with respect to the axis to accommodate an estimated axially asymmetrical distribution of the secondary particles at the detector with respect to a beam axis of a charged particle beam optical column.

11. The system of claim 10, further comprising a source configured to emit a primary beam of energetic particles that impinge on the sample.

12. The system of claim 11, wherein system is configured to perform a line scan of the primary beam across the sample in a first direction in conjunction with translation of the sample in a second direction that is different from the first direction.

13. The system of claim 12, further comprising an image generator configured to produce an image of the sample from a signal produced by the detector in conjunction with translation of the sample in a second direction that is different from the first direction.

14. The system of claim 10, wherein the charged particle optical system is a scanning electron microscope (SEM) system, wherein the system further includes an electron source configured to emit primary electrons, and wherein the charged particle optical column is configured to direct the primary electrons onto the sample.

15. The system of claim 14, wherein the detector is located between the electron source and an end of the charged particle optical column that is closest to the sample, wherein the detector includes an aperture configured to allow at least a portion of the primary electrons to pass through the detector towards the target.

16. The system of claim 15, wherein the aperture is surrounded by an inactive area, wherein the aperture and the inactive area are sized to keep signal losses due to clipping of detection of the secondary charged particles to less than 1%.

17. The system of claim 10, wherein the charged particle optical system is a focused ion beam system, ultraviolet photoelectron spectroscopy (UPS) system, X-ray photoelectron spectroscopy (XPS) system, auger electron spectroscopy (AES) system, and/or Secondary Ion Mass Spectroscopy (SIMS) system.

18. The system of claim 10, wherein the detector further comprises a metallization layer on portions of the detector other than the active portion, wherein the metallization layer is formed as an integral part of the detector.

19. The system of claim 10, wherein the detector is a diode device having a junction and a depletion region.

20. The system of claim 10, wherein the active portion is a single sector-shaped region of the surface of the substrate.

* * * * *